United States Patent

James

Patent Number: 5,308,387
Date of Patent: May 3, 1994

[54] PRE-ETCH TREATMENT OF A PLASTIC SUBSTRATE

[75] Inventor: Barry S. James, Rugby, England

[73] Assignee: Elf Atochem North America, Inc., Philadelphia, Pa.

[21] Appl. No.: 893,190

[22] Filed: Jun. 3, 1992

Related U.S. Application Data

[63] Continuation-in-part of Ser. No. 597,290, Oct. 12, 1990, abandoned, which is a continuation of Ser. No. 244,900, Sep. 15, 1988, abandoned.

[30] Foreign Application Priority Data

Sep. 25, 1987 [GB] United Kingdom ............... 8722643
Dec. 23, 1987 [GB] United Kingdom ............... 8730038

[51] Int. Cl.$^5$ .................. C09K 3/00; B05D 3/10
[52] U.S. Cl. ................ 106/1.11; 106/287.14; 106/311; 427/307
[58] Field of Search .......... 106/1.11, 311, 287.14; 427/307

[56] References Cited

U.S. PATENT DOCUMENTS

| | | | |
|---|---|---|---|
| 4,125,649 | 11/1978 | Donovan et al. | 427/307 |
| 4,941,940 | 7/1990 | Patel et al. | 427/307 |
| 5,019,425 | 5/1991 | Römer et al. | 427/307 |
| 5,049,230 | 9/1991 | Patel et al. | 427/307 |

*Primary Examiner*—R. Bruce Breneman
*Assistant Examiner*—Patricia L. Hailey
*Attorney, Agent, or Firm*—Stanley A. Marcus; Robert B. Henn

[57] ABSTRACT

An aqueous solvent composition for pre-etching plastic materials prior to plating with metal consists essentially of an aqueous solution containing a component selected from diethylene glycol monobutyl ether acetate, diethylene glycol monoethyl ether acetate, and mixtures thereof, and preferably containing a surfactant.

4 Claims, No Drawings

PRE-ETCH TREATMENT OF A PLASTIC SUBSTRATE

BACKGROUND OF THE INVENTION

1. Cross-Reference to Related Applications:

This application is a continuation-in-part of my co-pending application Ser. No. 07/597,290, filed Oct. 12, 1990, which was in turn a continuation of then co-pending application Ser. No. 07/244,900, filed on Sep. 15, 1988, both earlier applications now being abandoned.

2. Field of the Invention

The present invention is in the field of solvent compositions for use in preparing the surface of a plastic material for plating with a metal, a method of preparing the surface of a plastic material using such a solvent composition, and of metal-plated articles comprising a substrate of plastic material, wherein the surface of the plastic material is prepared for plating by the method.

3. Description of the Prior Art

There is an increasing demand for articles of plastic materials plated with a metal. Such articles combine the appearance of solid metal with the lightness and relative cheapness of a plastic material. Further, there is an increasing demand in the electronic industries for metal-plated plastics in the form of casings for electronic apparatus; the metal coating can provide essential EMF shielding which could otherwise only be provided by a much heavier and more costly solid-metal housing.

It is known that plastic materials, which are electrically non-conductive, can be plated by a procedure which involves etching the surface of the plastic material, sensitizing the etched surface by applying to it a very thin layer (e.g., of molecular thickness) of a noble metal such as palladium or platinum, applying a coating of a conductive metal, such as copper or tin, to the sensitized surface using an autocatalytic electroless solution, and forming a thicker metal coating by electrolysis.

The above-mentioned etching step is of great importance, because it appears that the etching of the surface of the plastic material enables it to form a bond with the metal plating. Etching is generally preceded by degreasing, using a caustic detergent mixture. After rinsing, the surface of the plastic material is then generally pre-etched with a solvent, for example an aqueous solution of a chlorinated solvent as disclosed in British Patent Specification No. 1,544,456.

Solvent pre-etching is intended to improve the adhesion between the surface of the plastic and the metal plated thereon, although it is not required for every plastic material: for example, some grades of acrylonitrile-butadiene-styrene (ABS) resin do not require a solvent pre-etch step. Whether or not solvent pre-etching has been carried out, the plastic material is subjected to a chromic-acid etch, and it is during this chromic-acid etching that the appearance of the surface of the plastic materials begins to change by the formation of very fine surface cracks. It is this fine surface cracking that provides the key and enables the subsequently plated metal layer to form a strong bond with the surface of the plastic material.

After the chromic-acid etching step, and prior to the metal-plating steps, the surface of the plastic material is thoroughly rinsed.

The chlorinated solvents currently used for the solvent pre-etch are notorious pollutants, and investigations have therefore been carried out in an attempt to find an alternative solvent composition for the solvent pre-etch step which is less environmentally harmful.

SUMMARY OF THE INVENTION

The present invention now provides a solvent composition for use in preparing the surface of a polycarbonate, polysulfone, or polyester plastic material for plating with a metal, wherein the composition comprises an aqueous solution containing a component selected from the group consisting of diethylene glycol monobutyl ether acetate, diethylene glycol monoethyl ether acetate, and mixtures thereof.

The glycol-ether ester components should be dissolved in the aqueous medium, and if appropriate, solubilized by a component selected from (a), compounds of the general formula $HO(CH_2CH_2O)_mR$, wherein R is lower alkyl, and m is a lower integer, and (b), compounds of the general formula $CH_3(OH)CH CH_2(OC_3H_6)_pR'$, wherein R' is lower alkyl, and p is zero or a lower integer.

The invention also provides a method of preparing the surface of a plastic material for plating with a metal, which method comprises applying to the surface a solvent composition of this invention.

Further, the present invention provides a metal-plated article comprising a substrate of plastic material, the surface of which plastic material is prepared for plating by a method of this invention.

The compounds of this invention have been found to be effective in the solvent pre-etching of plastic substrates, and yet are much less environmentally harmful than the conventionally used chlorinated solvents. Furthermore, the present invention permits the formulation of a solvent composition in which the active components have a low evaporation rate and a high flash point, both properties being important considerations in terms of economy and safety in industrial practice.

DESCRIPTION OF THE PREFERRED EMBODIMENTS

The expression "lower alkyl" in this specification includes straight-chain and branched alkyl radicals having from 1 to about 6 carbon atoms; the expression "lower integer" includes the number from 1 to 5.

In the present invention, it is particularly preferred to use diethylene glycol monobutyl ether acetate, $CH_3COO-CH_2CH_2OCH_2CH_2OC_4H_9$, diethylene glycol monoethyl ether acetate, $CH_3COO-CH_2C-H_2OCH_2CH_2OC_2H_5$, or a mixture thereof.

As a guide, diethylene glycol monoethyl ether acetate is preferably used at a concentration of from about 20 to about 25 percent by weight (wt. %) in the aqueous solvent composition. Diethylene glycol monobutyl ether acetate may be used in the form of an aqueous solution up to its solubility limit of about 6.5 wt. %, although this will vary according to the temperature used. Such a comparatively low solubility will entail the use of a long immersion time, although the solubility of the diethylene glycol monobutyl ether acetate can be increased by raising the temperature. However, long immersion times and the use of high temperatures may be impractical in an automated plant and, therefore, a coupling compound, in particular a solubilizing compound, will preferably be used in practice to increase the concentration of diethylene glycol monobutyl ether acetate or higher homologues.

A particularly preferred compound for use in the present invention is diethylene glycol monobutyl ether, $HOCH_2CH_2OCH_2CH_2OC_4H_9$.

The solvent compositions of the present invention contain a surfactant, preferably an anionic surfactant. It is also desirable that the surfactant be low-foaming. A preferred surfactant is 2-ethylhexyl sulfate, which is commercially available as an aqueous solution containing from about 38.5 to about 40.5 wt. % of the sodium salt, $C_4H_9CH(C_2H_5)CH_2SO_4Na$; this surfactant does not generate much foam and appears capable of solubilizing the etchant components. Thus, as verified in Example 4 hereinafter, the use of additional solubilizing surfactant may be considered. However, other surfactants come into consideration, including $C_4H_9CH(C_2H_5)C_2H_4(SO_4Na)C_2H_4CH(C_2H_5)_2$, $C_4H_9CH(C_2H_5)C_2H_4(SO_4Na)CH_2CH(CH_3)_2$, and the sodium salt of dodecylated diphenyl ether disulfonate, although the last-mentioned surfactant can generate considerable foam, but is nevertheless effective to solubilize the glycol-ether ester components.

The relative proportions of the components of the solvent compositions may be adjusted according to the conditions of use. Preferably, 0.625 to 2.5 parts by weight of surfactant component will be present per part by weight of glycol-ether ester component.

Expressed in different terms, preferred compositions of the invention may comprise, in aqueous solution, from about 50 to about 250, preferably from about 96 to about 168, milliters (ml) of the components diethylene glycol monobutyl ether acetate or diethylene glycol monobutyl ether, or mixtures thereof, per liter (l) of aqueous solution, with a concentration of surfactant appropriate to the particular process.

The present invention also contemplates the provision of a concentrated mixture for economical transportation to the end-user, which mixture can be diluted with water, as appropriate, before use. It will be understood by those skilled in the art that the presence of one or more additional, non-deleterious components is not precluded.

The solvent composition according to this invention can be used to pre-etch the surface of a variety of plastic materials, for example, polycarbonates, polysulfones, polyesters and ABS resins.

The surface of the plastic material is preferably treated by dipping it into the aqueous solvent composition at a temperature and for a period of time sufficient to ensure a satisfactory adhesion between the surface of the plastic and sufficient to ensure a satisfactory adhesion between the surface of the plastic and the metal to be plated onto the plastic in a subsequent stage. Preferably, the surface of the plastic material is immersed in the solvent composition for from about two to about five minutes, more preferably from three to five minutes, at a temperature in the range of from about 50 to about 60 degrees Celsius (° C.), typically at about 55° C. After removal from the solvent composition and rinsing, the surface of the plastic material can then be etched with chromic acid, causing the appearance of the surface cracking referred to hereinabove, and is then rinsed again. The etched-plastic surface may then be plated in a conventional manner, for example by means of a sensitizing step with a noble metal, followed by the electroless application of a conductive-metal coating from solution, followed by the electrolytic deposition of a final, thicker metal coating.

As pre-etching proceeds, the aqueous solvent solution may become low in active compounds for a number of reasons, such as drag-out and absorption by the surface of the plastic material. To correct for this loss of active compound, a maintenance solution containing higher concentrations of the active compounds can be added to the pre-etch solution, as appropriate. The composition of the maintenance solution will depend upon a number of factors, including the quantity, size and shape of the component being pre-etched. However, for guidance, a typical maintenance solution may contain from 200 to 400 ml/l diethylene glycol monobutyl ether acetate, from 200 to 300 ml/l diethylene glycol monobutyl ether, and from about 80 to about 120 ml/l of an anionic surfactant, generally provided as a solution of the range of 35 to about 40 wt. % of active compound, the remainder of the maintenance solution being water.

The present invention is illustrated by the following examples.

EXAMPLE 1

An aqueous pre-etching solution containing 80 ml/l diethylene glycol monobutyl ether acetate, 80 ml/l of the sodium salt of 2-ethylhexyl sulfate, and 80 ml/l diethylene glycol monobutyl ether was prepared. The solution was heated to 55° C., and panels of filled polycarbonate were immersed in it for respectively 2, 3, 4 or 5 minutes (min.), after which they were rinsed in water and immersed for 20 min. at 75° C. in an etching solution containing 500 grams (g) per l of chromic acid and 350 g/l concentrated sulphuric acid. The panels were then rinsed again with water, and the chromic acid neutralized. A thin layer of palladium was then applied to the panels, over which was coated copper and nickel by the electroless process. The conventional electrolytic deposition of a final thick coating was omitted in order not to obscure any crack pattern that may be visible through the initial metal deposits.

After drying, the panels were visually examined and the adhesion of the metal coating measured. The results are summarized in Table 1.

TABLE 1

| Immersion time in pre-etching solution. minutes | Adhesion of metallic coating and appearance |
|---|---|
| 2 | Poor adhesion; no cracks; numerous spots |
| 3 | Moderate adhesion; some cracking but spots when cracking not present |
| 4 | Good ahesion; regular even crack pattern |
| 5 | Good adhesion; even crack pattern |

EXAMPLE 2

A pre-etching solution was prepared containing 100 ml/l diethylene glycol monobutyl ether acetate, 100 ml/l diethylene glycol monobutyl ether, 100 ml/l sodium 2-ethylhexyl sulfate, and made up with water.

Polycarbonate panels were immersed in the solution for 2, 3, 4 or 5 minutes at 55° C., and then processed further, as described in Example I. The results are summarized in Table 2.

TABLE 2

| Immersion time in pre-etching solution minutes | Adhesion of metallic coating and appearance |
| --- | --- |
| 2 | Poor adhesion, no crack pattern badly spotted |
| 3 | Good adhesion, good crack patterns |
| 4 | Good adhesion, good crack patterns |
| 5 | Good adhesion, good crack patterns |

EXAMPLE 3

A pre-etching solution was prepared containing 120 ml/l diethylene glycol monobutyl ether acetate, 120 ml/l diethylene glycol monobutyl ether, 100 ml/l solution of 40% sodium 2-ethylhexyl sulfate in water, and made up with water. Polycarbonate panels were immersed in the solution for 2, 3, 4 or 5 minutes at 55° C. and then further processed as described in Example 1.

Each panel exhibited good adhesion, and had a good crack pattern.

EXAMPLE 4

A solution was prepared containing 132 ml/l diethylene glycol monobutyl ether acetate and 255 solution of 40% sodium 2-ethylhexyl sulfate in water. Polycarbonate panels were immersed for 1, 2, 3, 4 and 5 minutes in this solution at 55° C. and then further processed as described in Example 1.

Each panel exhibited good adhesion and a good crack pattern.

Modifications and improvements to the preferred forms of the invention disclosed and described herein may occur to those skilled in the art who come to understand the principles and precepts hereof. Accordingly, the scope of the patent to be issued hereon should not be limited solely to the embodiments of the invention set forth herein, but rather should be limited only by the advance by which the invention has promoted the art.

What is claimed is:

1. A method of preparing the surface of a polycarbonate, polysulfone, or polyester for plating with a metal, which method comprises applying to the said surface a solvent composition consisting essentially of an aqueous solution containing a component selected from the group consisting of diethylene glycol monobutyl ether acetate, diethylene glycol monoethyl ether acetate, and mixtures thereof.

2. The method of claim 1 wherein the solvent composition contains from about 50 to about 250 ml of a component selected from the group consisting of diethylene glycol monobutyl ether acetate, diethylene glycol monoethyl ether acetate, and mixtures thereof, per liter of aqueous solution.

3. The method of claim 1 wherein the solvent composition contains from about 96 to about 168 ml of a component selected from the group consisting of diethylene glycol monobutyl ether acetate, diethylene glycol monoethyl ether acetate, and mixtures thereof, per liter of aqueous solution.

4. The method of claim 1 wherein the solvent composition contains a surfactant.

* * * * *